United States Patent
Haase et al.

(10) Patent No.: US 7,095,252 B2
(45) Date of Patent: Aug. 22, 2006

(54) CHARGE SHARING REDUCTION BY APPLYING INTRINSIC PARALLELISM IN COMPLEX DYNAMIC DOMINO TYPE CMOS GATES

(75) Inventors: Michael Haase, Duesseldorf (DE); Wilhelm Haller, Remshalden (DE); Rolf Sautter, Bondorf (DE); Christoph Wandel, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 82 days.

(21) Appl. No.: 10/896,836

(22) Filed: Jul. 22, 2004

(65) Prior Publication Data

US 2005/0040861 A1    Feb. 24, 2005

(30) Foreign Application Priority Data

Aug. 21, 2003   (EP)   ................... 03102618

(51) Int. Cl.
*H03K 19/096*   (2006.01)
*H03K 19/00*    (2006.01)
*H03K 19/20*    (2006.01)
*H03K 19/094*   (2006.01)

(52) U.S. Cl. ........................... 326/95; 326/93; 326/94; 326/95; 326/96; 326/97; 326/98; 326/112; 326/119; 326/121

(58) Field of Classification Search ............ 326/93–98, 326/112, 119, 121
See application file for complete search history.

(56) References Cited

U.S. PATENT DOCUMENTS

| 6,087,855 | A  | * | 7/2000  | Frederick et al. | ........... 326/106 |
| 6,570,408 | B1 | * | 5/2003  | Nowka           | ........... 326/95  |
| 6,667,637 | B1 | * | 12/2003 | Mikan, Jr.      | ........... 326/98  |
| 6,914,453 | B1 | * | 7/2005  | Dhong et al.    | ........... 326/98  |
| 2003/0034801 | A1 | * | 2/2003 | Nowka          | ........... 326/98  |
| 2005/0083082 | A1 | * | 4/2005 | Olofsson       | ........... 326/95  |

* cited by examiner

*Primary Examiner*—Rexford Barnie
*Assistant Examiner*—Dylan White
(74) *Attorney, Agent, or Firm*—John E. Campbell

(57) ABSTRACT

The present invention relates to dynamic hardware logic of computer processors. In particular, it relates to a method and respective system for operating a dynamic logic circuit implementing some predetermined logic function with reduced charge sharing. In order to further reduce charge sharing it is proposed to provide a predetermined number of pre-engineered switching arrangements (24, 26, 28) implementing the same logic function with a different combinatorial distribution of input variables (A, B, C), wherein each arrangement is connected between said precharged node of higher potential and a lower potential.

8 Claims, 4 Drawing Sheets

CHARGE SHARING REDUCTION BY APPLYING INTRINSIC PARALLELISM IN COMPLEX DYNAMIC DOMINO TYPE CMOS GATES

FIELD OF THE INVENTION

The present invention relates to dynamic hardware logic of computer processors. In particular it relates to a method and respective system for operating a dynamic logic circuit with reduced charge sharing.

BACKGROUND OF THE INVENTION

Dynamic hardware logic and in particular that one of the domino type allows very complex logic functions to be implemented, as only NFET transistors realize the logic function. The P-FET part is only used to precharge the circuitry. Thus, in such circuitry a logic function is usually implemented between a node precharged to a higher voltage potential of said circuit, for example a supply voltage, herein abbreviated as Vdd, and a lower potential, for example ground, which function processes a plurality of input variables A, B, C, . . . . Such circuit is usually implemented in some single combinatorial switching arrangement, i.e. a net of transistors, which are arranged in a particular way including parallel and/or serial connections between Vdd and ground potential.

Generally, for example when implemented in dynamic MOS logic, special care has to be taken to hold the above-mentioned precharged node on its defined level as to voltage potential, as amongst others the effect of "leakage" and "charge sharing" tend to reduce the voltage level at this precharged node, which can lead to malfunction. In short words, charge sharing means that the charge which has been entered into the precharged node flows away into the capacities built up by the next transistors connected next to the node in direction to ground. In particular in such cases, in which a stack of transistors connected in series or connected in parallel are switched on, a considerable charge quantity flows into the capacities of these transistors, which may lead to a respective considerable voltage drop at the precharge node. This may lead to malfunction of the logic.

With reference to FIG. 1 in prior art it is known to apply so-called "keeper-devices" and/or "bleeder-devices" which try to supply charge to the precharge node temporarily or continuously, respectively. This reduces the charge sharing effect, but also slows down the switching of the circuit. Keeper and bleeder devices charge the node 10, which works against and slows down the discharge of this node in case the logical function forces a discharge of node 10.

This problem will be better understood by the description next below: in FIG. 1 the node 10 denoted as "pre_1" is the above-mentioned precharge node. During the so-called reset phase it is precharged to a certain voltage level, e.g. the supply voltage Vdd. This is done by the control of the reset transistor 12 which when switched to "pass" connects the precharge node to the voltage source Vdd.

A "half latch" 22 surrounded by broken lines comprises an inverter 21, the output of which is connected to the gate of transistor 20, which connects the supply voltage with the precharge node when it is opened by the inverter 21. This transistor 20 acts as a keeper device provided for keeping the voltage high in case the precharge node looses some charge to transistors 13 or 14.

During the evaluation phase of the circuit, when some input setting is connected to the control inputs of the NFETs 13, 14, 15, the transistors remove this charge to ground, if the logic condition as defined by the value of the logic input variables A, B, C, turns "ON", i.e., to pass mode, all transistors on the path depicted between the precharged node 10 and ground terminal 16. If only a part of said transistors are turned "ON" without opening up a connection between the precharged node and ground, then the node has to keep its charge. When, for example transistors 13 and 14 are switched to pass mode then the precharge node 10 must share its charge with those active transistors 13, 14. Thus, basically the keeper device 20, which was already mentioned above and is depicted in the right top portion of FIG. 1 is used in prior art in an enlarged dimension in order to compensate the charge sharing and keeping the voltage high at the precharge node.

An increased keeper device, however, increases disadvantageously the lump capacitance of the precharge node 10 and decreases the switching performance during the evaluation phase.

A further approach to reduce the problematic effects of charge sharing in such dynamic logic gates is disclosed in U.S. Pat. No. 5,317,204 assigned to Hewlett Packard Company. In this patent it is disclosed to reduce the interstitial space between parallel transistor gates in order to minimize such parasitic capacitance. Further, it is disclosed to dispose transistor gates adjacent to one another in order to let the transistors share a common interstitial space with a region of each transistor gate adjacent a region of each of the other remaining gates.

These measures, however, are not yet sufficient in particular for circuits which comprise more complex logic functions with an increased amount of transistors (e.g. 8 or more) or longer stacks of transistors, as for example a path comprising a number of 5 to 8 transistors switched in series.

SUMMARY OF THE INVENTION

It is thus an objective of the present invention to provide an improved method and system for operating dynamic logic with reduced charge sharing.

According to its broadest aspect the present invention provides a method for operating a dynamic logic circuit with reduced charge sharing, said circuit implementing a predetermined logic function between a node precharged to a higher potential of said circuit, preferably Vdd, and a lower potential, preferably ground, which function processes a plurality of input variables and is able to be represented in a single combinatorial switching arrangement comprising one or more paths switched in series and/or in parallel with respective N-transistor devices, which method is characterized by the steps of:

a) providing and operating a predetermined number of pre-engineered switching arrangements implementing the same logic function with a different combinatorial distribution of said input variables, or a pre-engineered switching arrangement implementing a subset of the main logical function with a different and adjusted combinatorial distribution of the input variables, each arrangement being connected between said precharged node of higher potential and said lower potential, preferably ground, and b) providing and operating said N-transistors comprised of said multiple paths with reduced capacitance compared to the single arrangement for reducing the leakage resulting from said multiple switching arrangements.

Thus, averaged over a distribution of input variable settings, charge sharing is reduced because a reduced amount of charge gets lost into the parasitic capacitance of transistors, which are switched to pass and blocked from being grounded by any "Off" switched transistor.

Further, it is advantageous, when each pre-engineered switching arrangement comprising said "duplicated circuits" has a different input variable connected to the transistor being connected to the precharge node, i.e. the first transistor (i.e. the most top located in the drawings).

When the dynamic logic is of the Domino type, then the inventive method is well suited to achieve the above reduction of charge sharing.

The invention can basically be applied for nearly any logic function implementation. It is not restricted to, but can be in particular advantageously applied for the carry logic of an adder circuit, or for a shifter circuit.

BRIEF DESCRIPTION OF THE DRAWINGS

The present invention is illustrated by way of example and is not limited by the shape of the figures of the drawings in which.

Figure 1:
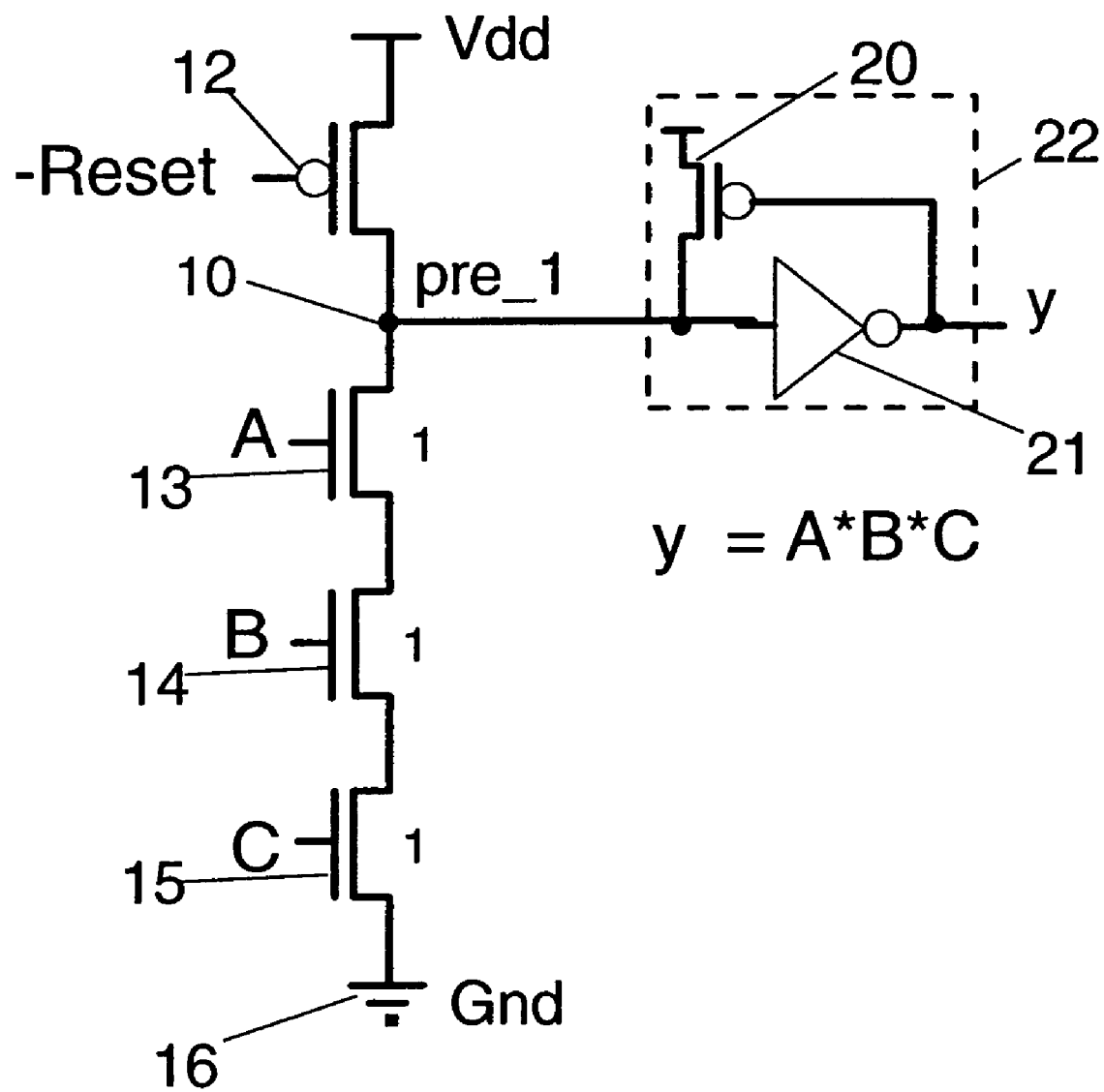
FIG. 1 is a schematic representation of a prior art domino type AND gate processing the input variables A, B, C and implementing the logic function y=A AND B AND C, which can be read at the output denoted with y.

DETAILED DESCRIPTION OF THE PREFERRED EMBODIMENT:

With general reference to the figures and with special reference to FIG. 2 the general inventive approach is illustrated with the description of an exemplary embodiment, as follows:

Instead of implementing only one "stack" of three transistors 13, 14 and 15, as shown in FIG. 1, according to this embodiment a number of three stacks 24, 26, 28 of transistors are switched in parallel, whereby each stack has a different input variable controlling the gate input of the transistors 25, 27, 29 connected next to the precharged node 10, "pre_2."

Further, each of said transistors is implemented in a reduced size and has thus a capacitance, which can be assumed to be ⅓ of that one present in the transistors used in FIG. 1, i.e. in prior art. In particular the first stack of transistors comprises transistors 25, 25', 25", the gate of each is connected to input variable A, B, C, respectively.

The second transistor stack 26 is constructed similarly, but implements first transistor 27 gate connected to input variable B, second transistor (reference signs are left out to improve clarity of the drawing) gate being connected to variable C and third transistor gate being connected to input variable A, thus implementing a "B-C-A" stack. Finally, the third stack 28 is similarly constructed and implements "C, A, B".

The keeper device and the reset transistor are arranged in the same way as described above with reference to FIG. 1.

Figure 2:
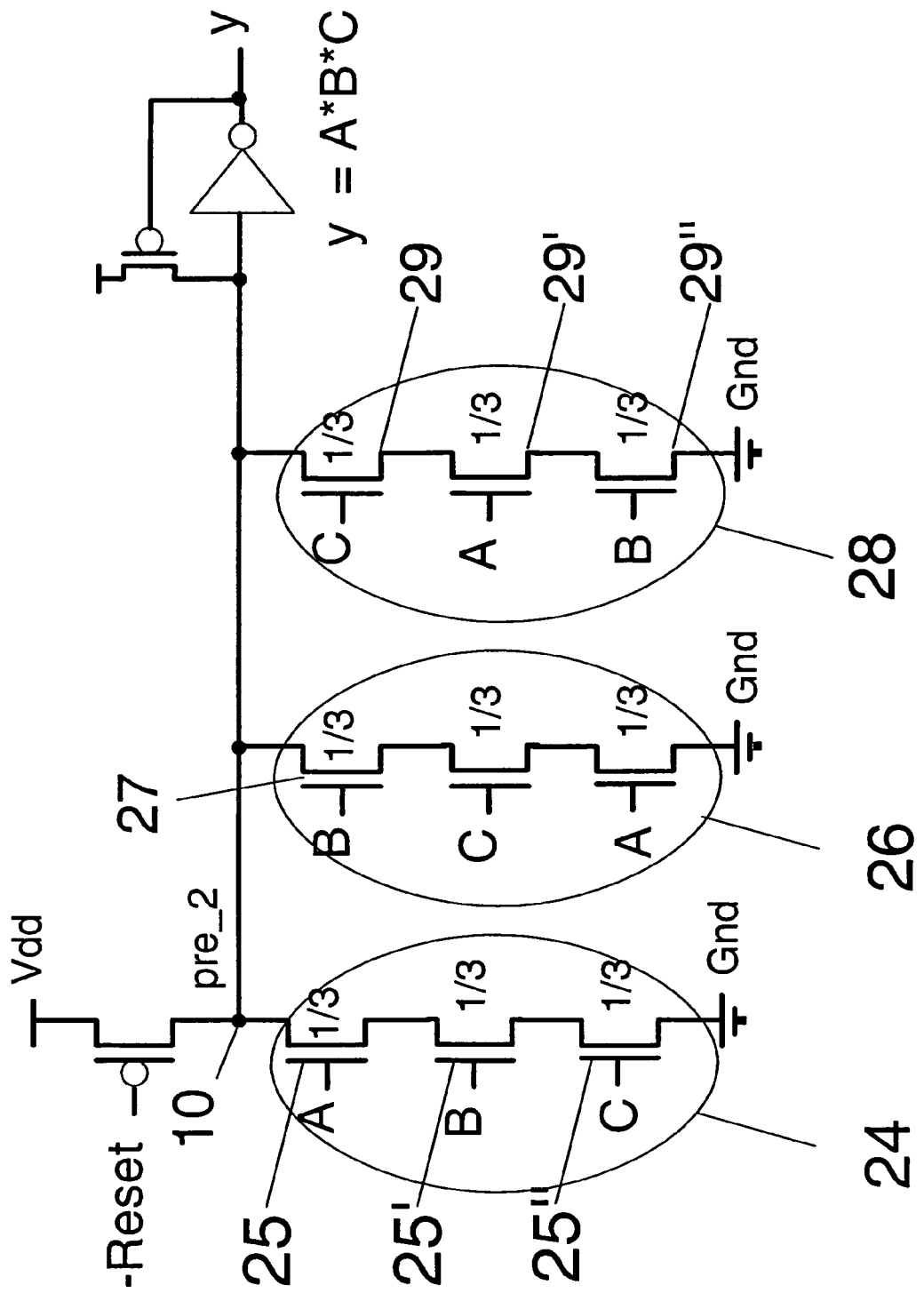
FIG. 2 is a representation implementing the logic function of FIG. 1 according to a preferred embodiment of the present invention, typified by a simple AND function.

With further reference to table 1 illustrating the amount of charge sharing visible at the precharge node 10 in FIG. 1 and FIG. 2 dependent of the input variable setting of A, B, C, the charge sharing effect of FIG. 1 is compared to the situation provided according to the inventive embodiment depicted in FIG. 2.

TABLE 1 charge sharing effect based on normalized device sizes

| Input Variable | | | $y = A*B*C$ logical output value | Prior art pre_1 amount of charge sharing | This invention pre_2 reduced charge sharing |
|---|---|---|---|---|---|
| A | B | C | | | |
| 0 | 0 | 0 | 0 | 0 | 0 |
| 0 | 0 | 1 | 0 | 0 | ⅓ |
| 0 | 1 | 0 | 0 | 0 | ⅓ |
| 0 | 1 | 1 | 0 | 0 | 1 |
| 1 | 0 | 0 | 0 | 1 | ⅓ |
| 1 | 0 | 1 | 0 | 1 | 1 |
| 1 | 1 | 0 | 0 | 2 | 1 |
| 1 | 1 | 1 | 1 | — | — |

Assuming normalized device sizes having easily numbered capacitance values as depicted in the drawings of FIG. 1 and FIG. 2, i.e. each transistor of FIG. 1 having a capacitance associated with the value 1, whereas each transistor of FIG. 2 having a capacitance with a value of ⅓, the third column of table 1 represents the amount of charge sharing in prior art, FIG. 1, whereas the fourth column represents the inventive charge sharing improved by the inventive idea. Each line represents a different input variable setting.

The first line represents "000" and the last line "111", and the remaining lines reflecting the six heterogeneous input settings. As reveals for example from line 2, i.e. input setting 001 means that in prior art only transistor 15 is switched through and thus transistor 13 being associated with A is off. This yields that the charge sharing in FIG. 1 (prior art) is zero.

According to the invention, in FIG. 2 the first stack 24 the second stack 26 provide a charge sharing of 0, whereas third stack 28 having transistors 29(C), 29' (A) and 29" (B) results in a charge sharing of ⅓ as the charge flows through the transistor 29 as its input variable is "1" and the transistor 29 being switched on.

A similar situation is in line 3, 010, in which the second stack causes a charge sharing of ⅓, as well. When the input setting is 011, i.e. only A is 0 and B and C is set to 1 the worst case is reached, which the invention has to envisage: here, the first stack charge sharing is 0, the second stack charge sharing is ⅓+⅓, and the third stack charge sharing is ⅓, resulting in a sum of 3*⅓=1. Still, this is only half of the worst case (WC) charge sharing condition of FIG. 1, line 7.

When, however, the input setting includes A to have a value of 1 the situation changes in favor to the inventive concept: in the fifth line (100) in prior art a charge sharing of 1 exists, whereas according to the invention only the first stack generates a charge sharing of ⅓. Thus, assuming a uniform input setting distribution the disadvantage of lines 2 and 3 is balanced already.

Further, in the sixth line (101) both concepts (prior art and inventive) produce the same charge sharing of 1 and in the seventh line (110) prior art generates a charge sharing of 2, whereas the inventive concept results in a charge sharing of 1. As the input settings of 000 generates no charge sharing at all and 111 results in a total discharge, a total advantage of the inventive method results in a best case (BC) charge sharing reduction of 50% in the input setting. Further, the inventive switching arrangement provides for stable conditions under any test conditions.

A further application of the inventive method will be described next below in an example which implements the following formula, which is needed in an adder circuit based on a so-called LING-structure:

$$Hx2=(h0*i0)+(h0*h1*i1)+(h0*h1*h2(h3+i2))=h0(i0+h1(i1+h2(i2+h3)))$$

Figure 3:
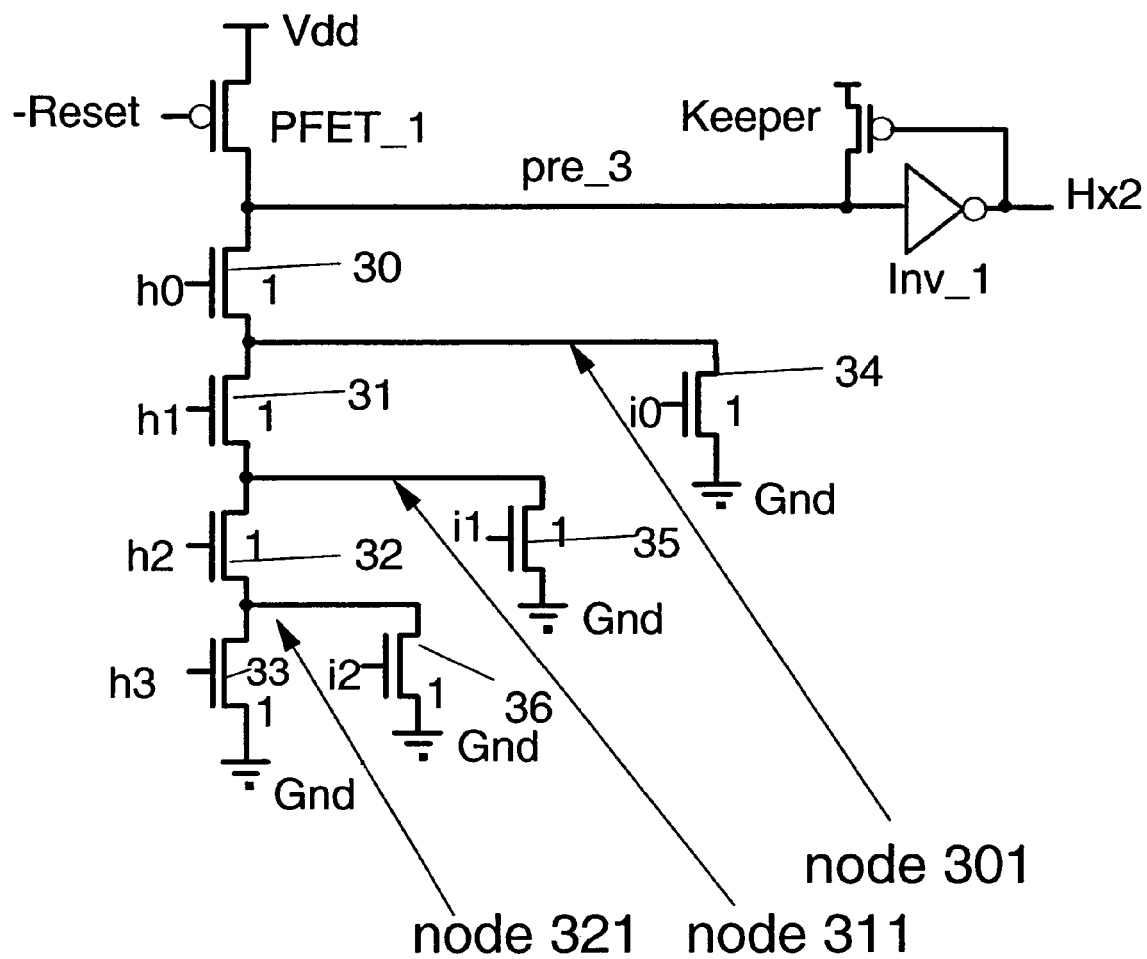
FIG. 3 is a schematic circuit representation of a prior art more complex logic AND-OR function used specially in adders based on Ling's formulas.
Figure 4:
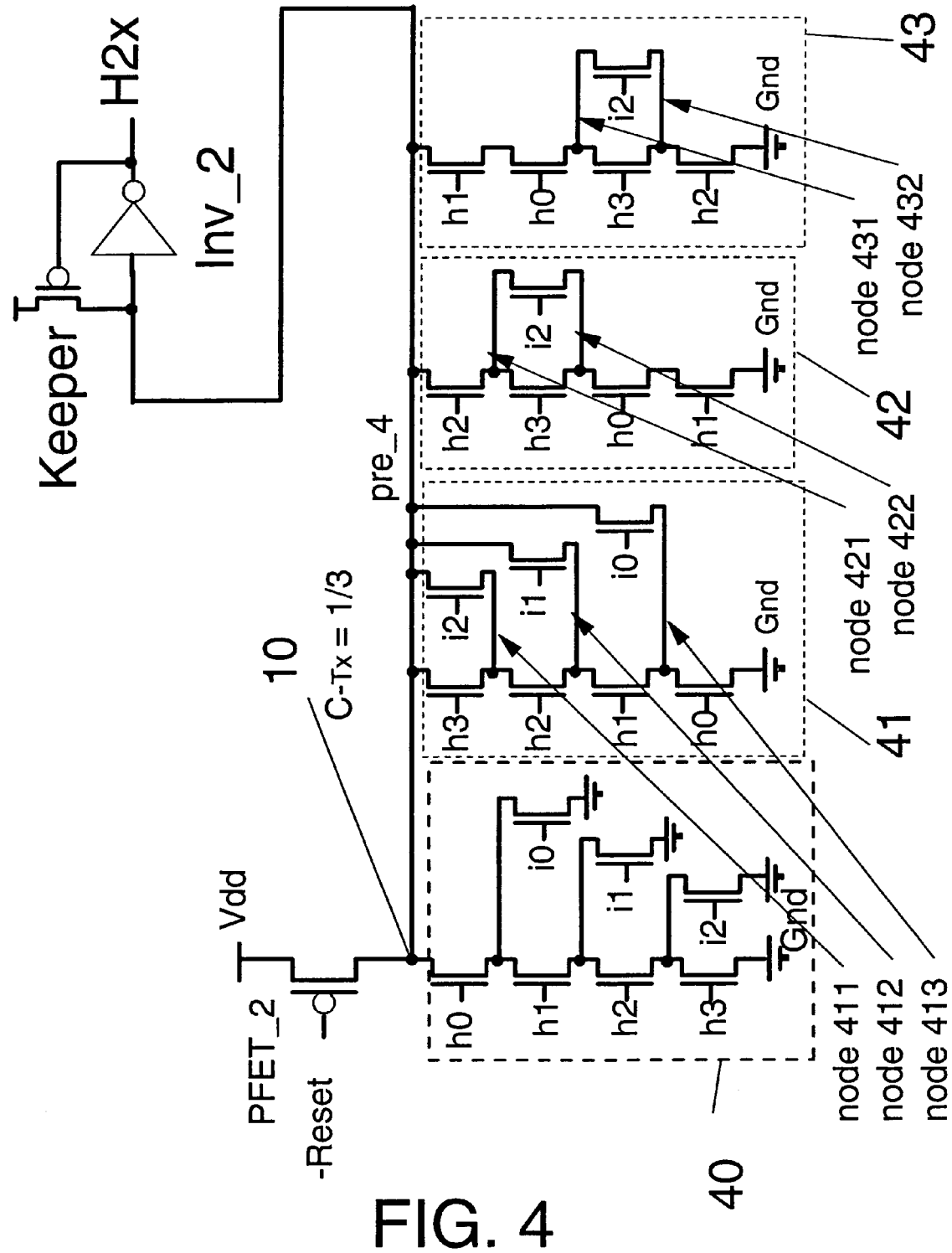
FIG. 4 is an implementation of the logic function of FIG. 3, but implemented according to a second embodiment of the present invention.

FIG. 3 is a prior art implementation of said-above formula, whereas FIG. 4 shows a possible inventive implementation, which may be realized amongst others in order to take profit of the inventive idea. As shows FIG. 3 a number of four transistors is connected in series, each gate of them being associated with the respective input variable, namely h0, h1, h2 and h3. Said transistors are denoted with reference sign 30, 31, 32 and 33 and have the same symbolic capacitance of a value of "1", as described before with reference to FIG. 1. Further, a transistor 34 is connected between a node 301 and ground, at the gate of which an input variable i0 is connected. The transistor 31 is similarly connected to a transistor 35 connected between node 311 and ground and gated by input variable i1. Also transistors 34, 35 and 36 have the same symbolic capacitance of a value of "1".

Further, transistor 32 is similarly connected to a transistor 36 gated with input variable i2, which is connected between node 321 and ground. Each of said transistors 34, 35, 36 is connected to ground, as well as transistor 33.

The inventive embodiment shown in FIG. 4 which may replace the circuit given in FIG. 3 implements the same logical function as shown in FIG. 3 with transistors having a reduced capacity, for example reduced by the factor of 3, i.e., to ⅓, which is not explicitly depicted in the drawing to increase clarity thereof. The precise capacity value is a matter of careful tuning and adjustment to the real needs.

The most left section in FIG. 4 is thus encircled with a frame 40 in broken lines in order to show identity to FIG. 3 circuit.

According to this inventive embodiment, however, further three transistor networks are added, which are shown to be encircled by frame 41, 42 or 43, respectively. The logic function in frame 41 has a stack of four transistors whereby the h3 transistor is on the top i.e. connected to the precharge node 10. The input variable sequence is h3, h2, h1, h0. Further, the i2 transistor is connected between precharge node and output of h3 transistor, the i1 transistor is connected between precharge node and node 412, and the i0 transistor is connected between precharge node and node 413. It represents the complete function Hx2=h0(i0+h1(i1+h2(i2+h3))), but the stack is swapped.

Further, the logic function in frame 42 comprises an h2, h3, h0, h1 stack, in which h2 transistor is closest to the precharge node, and an i2 transistor is connected between node 421 and 422. The logic function in frame 42 is only a subset of the complete logical function: h0h1h2(h3+i2). The original logical function cannot be completely rearranged a third time.

Further, the logic function in frame 43 comprises a transistor stack having the sequence h1, h0, h3 and h2 (h1 top most, in which an i2 transistor is connected between node 431 and 432. Keeper and reset devices are provided in both logic structures, as described before. As reveals from FIG. 4 not all possible combinations and permutations of the logic structure shown in FIG. 3 are implemented in FIG. 4. Instead, according to the inventive approach, only a predetermined number of pre-engineered switching arrangements, i.e. the transistor networks 41, 42 and 43 are provided. The selection, which permutations are preferably to be implemented and which other permutations are better not to be implemented, is determined by a respective preceding engineering step, which is individual to each logic to be improved. In many cases however, it is preferred to start each transistor stack with a different input variable transistor. This reveals from FIG. 4 at the first glance.

TABLE 2

| | Charge sharing/performance advantage | | | |
|---|---|---|---|---|
| IBM CMOS Technology, typical cond. Vdd = 1.08 V | schematic according FIG. 3 w/o Keeper | schematic according FIG. 4 w/o Keeper | schematic acc. FIG. 3 with Keeper | schematic acc. FIG. 4 with Keeper |
| Keeper dimension | — | — | 2 u | 1 u |
| precharged node pre_i drop | 0.57 V | 0.86 V | 0.93 V | 0.97 V |
| Switching time WC (Worst Case) | 35 ps | 33 ps | 40 ps | 33 ps |
| Switching time BC (Best Case) | 26 ps | 27 ps | 27 ps | 27 ps |
| comment | fails because of charge sharing | functional without failure under normal conditions | functional in all process corners | functional in all process corners. |

Table 2 shows the charge sharing performance advantages, whereby column 2 and 3 compare FIG. 3 and FIG. 4 without a keeper device, whereas both right most columns compare FIG. 3 and FIG. 4 schematics with a keeper device. In order to show the improvement provided by the invention the size of reset control transistor and inverter are kept equal in dimension. As shows column 1 and 2 the charge sharing voltage drop at node 10 is significantly reduced with the enhancements provided by the present invention. In FIG. 3 the precharge node voltage drops to 0.57 Volt, whereas in FIG. 4, the voltage stays above 0.86 Volt. Further, the worst case circuit switching time is improved by 2 picoseconds from 35 to 33 picoseconds. Further, the best case circuit switching time is only slightly slowed down by 1 picosecond.

Further, tests have shown that the circuit shown in FIG. 3 fails because of the effect of charge sharing, whereas the schematic as given in FIG. 4 according to the inventive embodiment is fully functional without any failure under normal conditions.

When a keeper device is added with a size tuned so that the voltage drop on the precharge nodes fall into the same range (e.g. 0.93 Volt and 0.97 Volt with a supply voltage Vdd of 1.08 Volt) the performance is better by almost 20%, which is shown by the table 2 contents of both most right columns. In particular switching worst case is reduced from 40 picoseconds to 33 picoseconds, which corresponds to about 20% improvement.

As a person skilled in the art should recognize from the foregoing description the charge sharing is substantially reduced, and performance may greatly be improved. Keeper or bleeder devices as well as the precharging devices can be reduced in size. Further, the inventive method allows higher and more complex N-FET stacks than prior art allows. By adding duplicated transistors the overall leakage becomes slightly higher, as there are more transistors connected to node 10. This is due to the facts, that the parasitic effects are not reduced in the same amount as the duplication factor reduces the size of the transistors.

This disadvantage is however tolerable because the slightly increased leakage may be easily compensated by a respective keeper device, as it is shown in the figures and known in prior art. The inventive principle can be basically applied in any logic circuit, as long as the engineering step, which is done prior to implementation of the duplicated and modified transistor nets result in an overall decrease of charge sharing. It should be added, however, that the AND logic shown in FIG. 1 and 2 is very simple structured and is selected herein primarily in order to demonstrate the basic invention approach.

It should be added that the handling of AND-OR combinations adds a lot of complexity, see back to FIG. 3. Care has thus to be taken when generating the modified "copies" of the N-Stack paths. Not all combinations are valid and some are duplicates. The logics implemented in Path 1 (40) and 2 (41) are logically equal but the arrangement is upside down.

There are logical functions which do not allow all possible sequences of the variables h0 to h3. AND-OR functions restrict the principle to a duplicated swapped arrangement and to subfunctions of the original one.

Path 3 (42) could in addition implement h0-h1-i1 but this term is already in path 2 (41). It would thus be a duplication without advantage for charge sharing. A rule of thumb can be as follows:

First, start with a swapped rearrangement of the main function. Then cut out partial logic functions without generating duplicated structures. Tune the circuitry and check if the voltage drop due to charge sharing is in a tolerable range. Add more subfunctions as long as an additional improvement can be achieved.

Finally, the disclosure of the present invention may be combined with the disclosure given in the U.S. Pat. No. 5,317,204 mentioned further above.

While the preferred embodiment of the invention has been illustrated and described herein, it is to be understood that the invention is not limited to the precise construction herein disclosed, and the right is "reserved" to all changes and modifications coming within the scope of the invention as defined in the appended claims.

What is claimed is:

1. A dynamic logic circuit having reduced charge sharing, the dynamic logic circuit comprising:
   a precharge circuit connected to an precharge node, the precharge circuit precharging the node to a first voltage level during a precharge period;
   a first logic circuit coupled to the precharge node, the first logic circuit comprising pre-engineered switching arrangements, the first logic circuit setting the precharge node to a second voltage level responsive to a predetermined combination of input signals during a non-precharge period, the first logic circuit comprising a plurality of pre-engineered switching arrangements a first pre-engineered switching arrangement comprising:
   a) a first transistor coupling a second node to the precharge node according to an input signal applied to a first gate of the first transistor, a second transistor coupling a third node to the second voltage level according to an input signal applied to a second gate of the second transistor and one or more third transistors coupling the second node to the third node according to one or more input signals applied to corresponding third gates of the one or more third transistors, the combination of the first transistor and the second transistor and the one or more third transistors performing a first predetermined logic function;
   b) a first input signal connected to the first gate of the first transistor;
   c) a second input signal connected to the second gate of the second transistor; and
   d) one or more third input signals connected to corresponding third gates of the one or more third transistors;
   a second pre-engineered switching arrangement comprising a fourth transistor coupling a fourth node to the precharge node according to an input signal applied to a fourth gate of the fourth transistor, a fifth transistor coupling a fifth node to the second voltage level according to an input signal applied to a fifth gate of the fifth transistor and one or more sixth transistors coupling the fourth node to the fifth node according to one or more input signal applied to corresponding sixth gates of the one or more sixth transistors, the combination of the fourth transistor and the fifth transistor and the one or more sixth transistors performing a second predetermined logic function wherein the second predetermined logic function is any one of the first predetermined logic function or a subset of the first predetermined logic function;
   the first input signal connected to any one of the fifth gate or one of the sixth gates, the first input signal not connected to the fourth gate; and
   the second input signal connected to any one of the fourth gate or one of the sixth gates, second input signal not connected to the fifth gate.

2. The dynamic logic circuit according to claim 1 wherein any one of the first voltage level or the second voltage level is any one of Vdd or Ground.

3. The dynamic logic circuit according to claim 1 further comprising one or more third pre-engineered switching arrangements, a third pre-engineered switching arrangement comprising:
   a seventh transistor coupling a seventh node to the precharge node according to an input signal applied to a seventh gate of the seventh transistor, an eighth transistor coupling a eighth node to the second voltage level according to an input signal applied to an eighth gate of the eighth transistor and one or more ninth transistors coupling the seventh node to the eighth node according to one or more input signals applied to corresponding ninth gates of the one or more ninth transistors, the combination of the seventh transistor and the eighth transistor and the one or more ninth transistors performing a third predetermined logic function wherein the third predetermined logic function is any one of the first predetermined logic function or a subset of the first predetermined logic function.

4. The dynamic logic circuit according to claim 1 wherein one or more of the pre-engineered switching arrangements further comprises one or more tenth transistors coupling any one of the second node, the third node or a node of interconnected third transistors to any one of the precharge node or the second voltage level according to an input signal applied to a tenth gate of the tenth transistor.

5. The dynamic logic circuit according to claim 1 wherein the dynamic logic is of the Domino type.

6. The dynamic logic circuit according to claim 1 wherein the first logic circuit consists of any one of a logical AND circuit, a logical OR circuit, carry logic of an adder circuit or a shifter circuit.

7. The dynamic logic circuit according to claim 1 wherein the first logic circuit comprises NFET transistors and the precharge circuit comprises one or more PFET transistors.

8. The dynamic logic circuit according to claim 1 further comprising a keeper circuit holding the precharge node at a precharge value.

* * * * *